United States Patent
Mizushima

[11] Patent Number: 5,920,793
[45] Date of Patent: Jul. 6, 1999

[54] METHOD FOR MANUFACTURING A THROUGH HOLE

[75] Inventor: Kazuyuki Mizushima, Tokyo, Japan

[73] Assignee: NEC Corporation, Tokyo, Japan

[21] Appl. No.: 08/739,787

[22] Filed: Oct. 30, 1996

[30]   Foreign Application Priority Data

Oct. 31, 1995 [JP] Japan .................................... 7-306491

[51] Int. Cl.⁶ ................................................ H01L 21/461
[52] U.S. Cl. ......................... 438/637; 438/624; 438/634; 438/636; 438/669; 438/700; 438/740
[58] Field of Search ..................... 437/195, 228, 437/190, 191, 192; 156/646.1, 662.1; 438/624, 623, 628, 634, 636, 637, 669, 970, 742, 740, 738, 737, 714, 700

[56]   References Cited

U.S. PATENT DOCUMENTS

| | | |
|---|---|---|
| 4,184,909 | 1/1980 | Chang et al. . |
| 4,523,372 | 6/1985 | Balda et al. . |
| 5,378,659 | 1/1995 | Roman et al. . |
| 5,451,543 | 9/1995 | Woo et al. . |
| 5,482,894 | 1/1996 | Havemann ............................... 437/195 |
| 5,496,771 | 3/1996 | Cronin et al. ............................ 437/187 |
| 5,505,816 | 4/1996 | Barnes et al. ......................... 156/662.1 |
| 5,700,737 | 12/1997 | Yu et al. . |
| 5,707,883 | 1/1998 | Tabara . |

FOREIGN PATENT DOCUMENTS 64-35937   2/1989   Japan .

*Primary Examiner*—Caridad Everhart
*Attorney, Agent, or Firm*—Sughrue, Mion, Zinn, Macpeak & Seas, PLLC

[57]   ABSTRACT

An underlying interconnecting layer is formed on a semiconductor substrate and a first insulating layer is formed on the underlying interconnecting layer and these are patterned. Next, a second insulating layer which is different in material from the first insulating layer is formed on the patterned first insulating layer and the semiconductor substrate and a portion of the second insulating layer is removed by etching to expose a portion of the first insulating layer. Next, the exposed first insulating layer is removed by etching. Next, a conductive layer is implanted in a through hole which is made in the removed first insulating layer and removed second insulating layer. Interconnecting layers are then formed on the conductive layer and the second insulating layer.

11 Claims, 6 Drawing Sheets

METHOD FOR MANUFACTURING A THROUGH HOLE

BACKGROUND OF THE INVENTION

1. Field of the invention

The present invention relates to a method for manufacturing a semiconductor device and more particularly to a method for manufacturing a through hole electrically connecting two interconnecting layers together.

2. Description of the prior art

As semiconductor devices have been largely integrated, the width and the spacing of an interconnecting layer electrically connecting elements together have been reduced. In particular, a gate array or the like has a standardized interconnecting layer channel and thus needs to reduce this interconnecting layer pitch for improving the degree of integration. In general, the interconnecting layer pitch is decided by the size and the alignment accuracy of the through hole connecting two different interconnecting layers.

FIG. 1 and FIG. 2 show the first conventional semiconductor device. An underlying interconnecting layer 102 is formed on a semiconductor substrate 101 forming an element, not shown. In this case, the underlying interconnecting layer 102 has a wide pad 102a at the place where a through hole is to be formed. And formed on the underlying interconnecting layer 102 is an inter-layer insulating layer 103 in which a through hole TH is formed. And then formed in the through hole TH is a conductive layer 104 on which an overlying layer 105 is formed. But a margin M between the interconnecting layer and the through hole TH is provided so that the through hole TH may not be bigger than the pad 102a of the underlying interconnecting layer 102, thereby improving a yield. As a result, the interconnecting pitch P of the underlying interconnecting layer 102;

$$P = 2 M + H + D$$

where H is the size of the through hole TH which is decided by taking into account an electromigration-resistant parasitic resistance and D is the minimum interconnecting spacing which is decided by taking into account the limit of manufacturing accuracy and the parasitic capacity to the adjacent underlying interconnecting layer.

The reason why the conventional semiconductor device needs the margin M between the interconnecting layer and the through hole is hereinafter described. As shown in FIG. 1, the pad 102a having the margin M is formed on the underlying layer 102 at the position where the through hole is formed. If the pad 102a does not have the margin M, the width of the underlying interconnecting layer 102 is the same as the width of the through hole TH. In this case, if a mask patterning for forming the through hole is not correctly made in position, the through hole is also formed on the other part of the underlying interconnecting layer 102; in other words, since the through hole is formed with the underlying layer as an etching stopper, if the mask patterning is not correctly made in position, there happens a portion where the etching stopper does not exist, which consequently forms a deeper through hole. To be more specific, a groove deeper than a usual through hole is formed along the side of the underlying interconnecting layer. This groove has narrow spacing and deep shape. When conductive material is implanted in the through hole with this groove formed, the conductive material cannot be implanted in the groove but the gas is hermetically packed in the groove. If there is the space where the gas is packed, breakage or the like will occur in the following manufacturing process and be a cause of a low yield. Therefore, the conventional semiconductor device has a margin between the interconnecting layer and the through hole such that the groove may not be made on the side of the interconnecting layer even if the mask patterning is not correctly made in position.

As such, the first conventional semiconductor device has a problem that the existence of the margin M between the interconnecting layer and the through hole makes the underlying interconnecting layer pitch larger and thus results in lowering a degree of integration.

The second conventional semiconductor device shown in FIG. 3(a)–FIG. 3(e) has been known as a semiconductor device which reduces the interconnecting pitch by removing above-described margin M between the interconnecting layer and the through hole (Japanese Published Unexamined Patent Application No. 64-35937). Firstly, referring to FIG. 3(a), an underlying interconnecting layer 202 is formed on a semiconductor substrate 201 forming an element, not shown, and moreover an inter-layer insulating layer 203 is formed on the whole of them. Further, the thickness of the inter-layer insulating layer 203 is smaller than that of the underlying interconnecting layer 202.

Next, referring to FIG. 3(b), the inter-layer insulating layer 203 is selectively removed from the underlying interconnecting layer 202a and the vicinity of it.

Next, referring to FIG. 3(c), the inter-layer insulating layer 204 is additionally formed on the whole of them.

Next, referring to FIG. 3(d), the inter-layer insulating layer 204 is etched back to expose the underlying interconnecting layer 202a. The condition of this etching-back is a condition in which the selection ratio of the inter-layer insulating layer 204 is larger than that of the inter-layer insulating layer 203; consequently, the inter-layer insulating layer 203 remains. Lastly, referring to FIG. 3(e), an overlying interconnecting layer 205 is formed and connected to the underlying interconnecting layer 202a.

As such, the second conventional semiconductor device does not have the margin between the interconnecting layer and the through hole.

However, in above-described second conventional semiconductor device the thickness of the inter-layer insulating layer 204 cannot be made larger than those of the underlying interconnecting layers 202a, 202b, and consequently, the parasitic capacity between the overlying interconnecting layer 205 and the underlying interconnecting layer 202b is made larger; this therefore produces a problem that the operating speed of the circuit is made lower and also produces a problem that since the overlying interconnecting layer 205 has an uneven surface, it is difficult to make a fine interconnecting and multi-layers of the interconnecting.

BRIEF SUMMARY OF THE INVENTION

Objects of the Invention

Accordingly, an object of the present invention is to provide a method for manufacturing a semiconductor device whose interconnecting pitch is made smaller without sacrificing the operating speed of a circuit and the flattening of the interconnecting.

Summary of the Invention

A method for manufacturing a semiconductor device according to the present invention comprises forming an underlying interconnecting layer on a semiconductor substrate; forming a first insulating layer on the underlying interconnecting layer; patterning the first insulating layer and the underlying interconnecting layer; next, forming a second insulating layer on the patterned first insulating layer and the semiconductor substrate; removing a portion of the second insulating layer by etching to expose a portion of the first insulating layer; next, removing the exposed first insulating layer by etching; further, implanting a conductive layer in a through hole which is made in the removed first insulating layer and the removed second insulating layer; forming a second interconnecting layer on the conductive layer and the second insulating layer, whereby a margin between the underlying interconnecting layer and the through hole is eliminated and over-etching produced at the forming of the through hole is minimized.

BRIEF DESCRIPTION OF THE DRAWINGS

The above described and other objects, features and advantages of the present invention will become more apparent with reference to the following detailed description of the preferred embodiment of the present invention taken in conjunction with the accompanying drawings, in which.

DESCRIPTION OF THE PREFERRED EMBODIMENT

A method for manufacturing a semiconductor device according to the present invention will be described with reference to FIGS. 4(a)–4(f).

Figure 1:
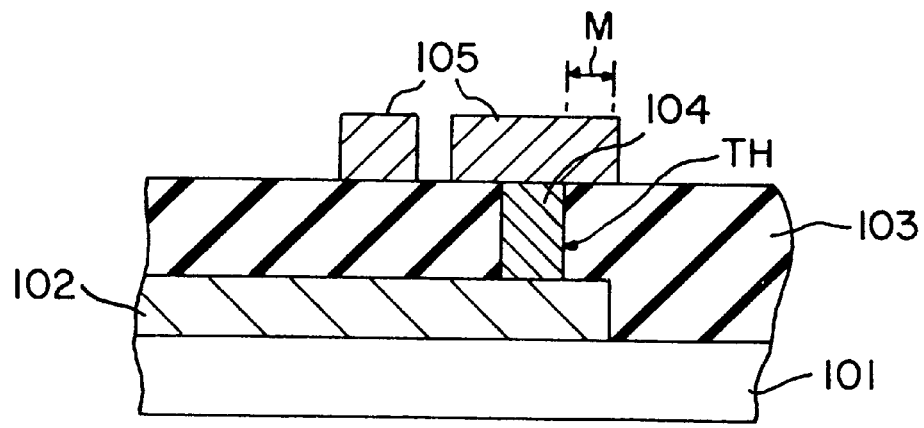
FIG. 1 is a cross-sectional view illustrating a structure of a conventional through hole.
Figure 2:
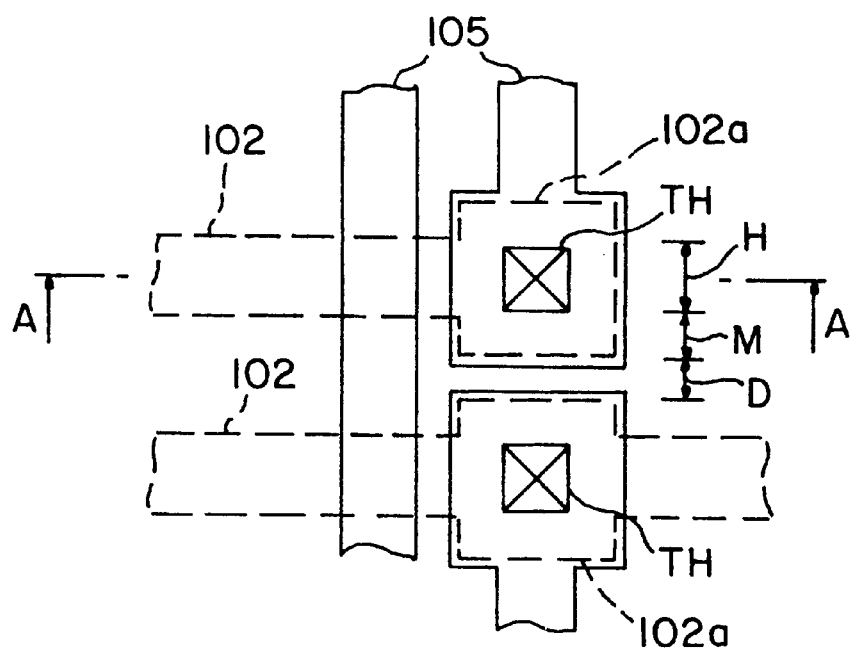
FIG. 2 is a plan view illustrating an interconnecting pattern including a conventional contact part.
Figure 3A:
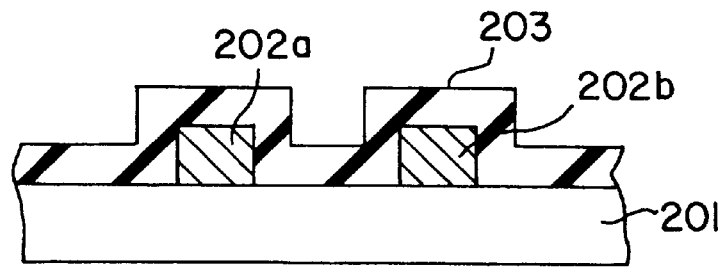
FIGS. 3(a)–3(e) are cross-sectional views of the semiconductor device illustrating a method for manufacturing a conventional semiconductor device in the order of processing.
Figure 3B:
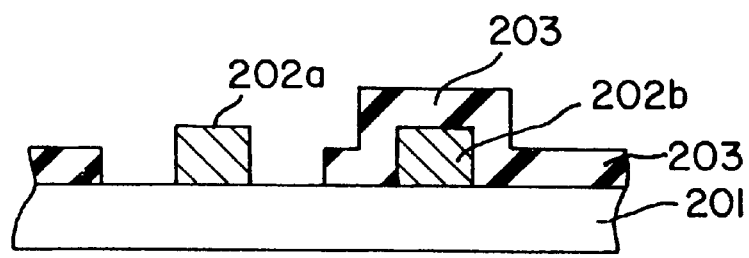
Figure 3C:
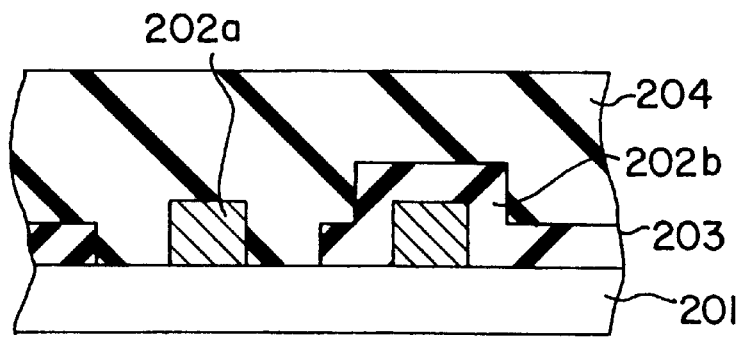
Figure 3D:
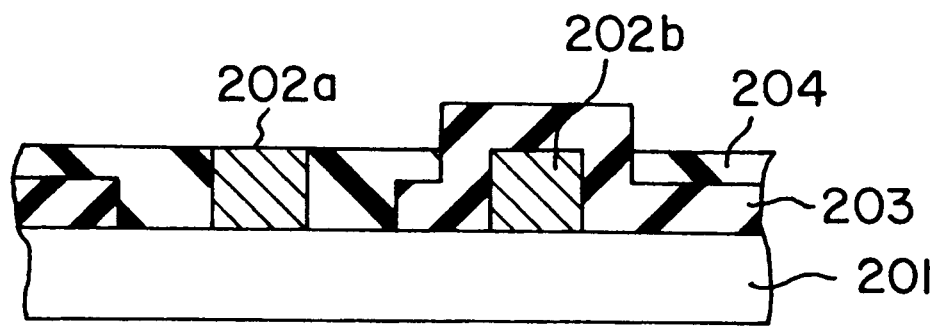
Figure 3E:
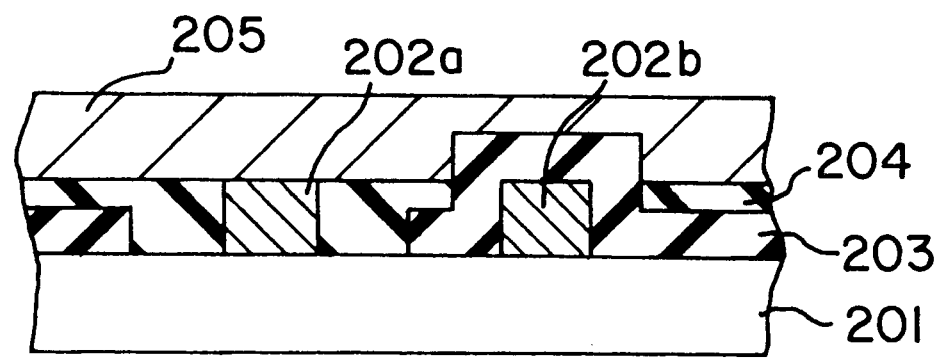
Figure 4A:
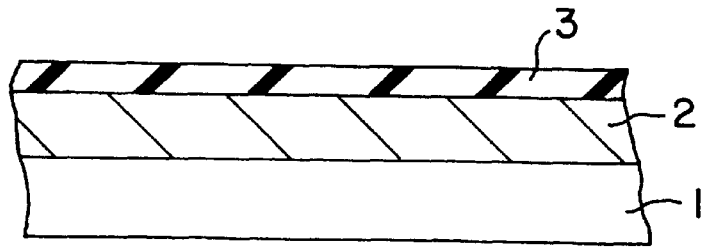
FIGS. 4(a)–4(f) are cross-sectional views of the semiconductor device illustrating a method for manufacturing a semiconductor device according to the present invention in the order of processing.

Firstly, referring to FIG. 4(a), an underlying interconnecting layer 2 comprising aluminum or aluminum alloy (aluminum alloy of aluminum and silicon, copper, titanium, or the like) is formed by a sputtering technique in about 400–800 nm thickness on a semiconductor substrate 1 forming elements (not shown), and then a silicon nitride layer 3 of about 100–200 nm in thickness is formed by a plasma CVD method.

Figure 4B:
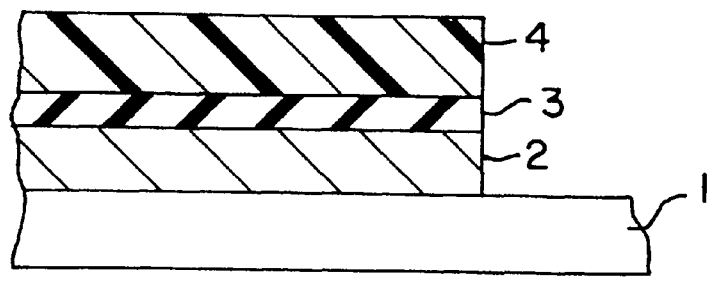

Next, referring to FIG. 4(b), a photoresist layer 4 is applied to form an underlying interconnecting layer pattern. Next, a silicon nitride layer 3 and the underlying interconnecting layer 2 is continuously dry-etched with the photoresist 4 as a mask and then the photoresist layer 4 is removed. Moreover, in this case, after a silicon nitride layer 3 is dry-etched with the photoresist 4 as a mask, the photoresist layer 4 may be removed and the underlying interconnecting layer 2 may be etched with a silicon nitride layer 3 as a mask.

Figure 4C:
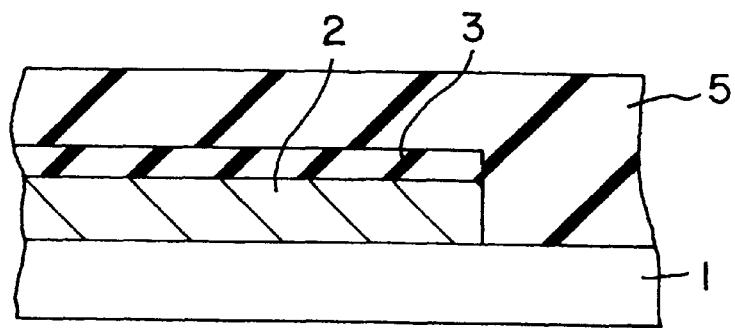

Next, referring to FIG. 4(c), a silicon oxide layer 5 of about 500–1000 nm in thickness is formed by a plasma CVD method. Moreover, the silicon oxide layer 5 is not necessarily a single layer but may be combined with a NSG layer comprising $O_3$/TEOS. Further, a portion of the layer may include a silica film formed by an applying method. Next, after a photoresist is applied to the surface of the silicon oxide layer 5, it is etched back to be planarized or is planarized by a chemical mechanical polishing (CMP) method.

Figure 4D:
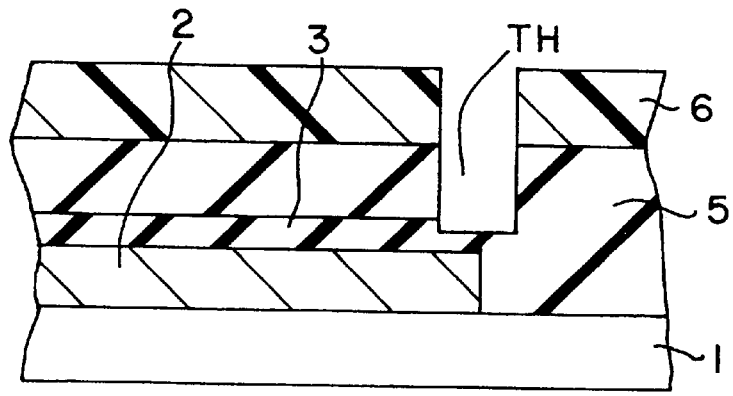

Next, referring to FIG. 4(d), a photoresist layer 6 is applied to this to make a through hole pattern. Next, the silicon oxide layer 5 is etched to form a through hole TH with the photoresist layer 6 as a mask until the silicon nitride layer 3 is exposed and a portion of the silicon nitride layer 3 is removed. Moreover, etching is performed by active ion etching of a mixed gas of $CF_4$ and $O_2$ with a ratio of 8 to 2: this makes the etching speed of the silicon oxide layer 5 equal to or less than that of silicon nitride layer 3. As a result, even if the through hole TH is not correctly positioned, the silicon oxide layer 5 is not etched more deeply than the silicon nitride layer 3 because of the difference in etching speed between the silicon oxide layer 5 and the silicon nitride layer 3: in other words, when etching is performed so as to form a through hole TH, if etching is finished with the silicon nitride layer 3 remaining, a groove is not formed on the side of the underlying interconnecting layer 2 because the silicon oxide layer 5 is not etched more deeply than the surface of the exposed silicon nitride layer.

Figure 4E:
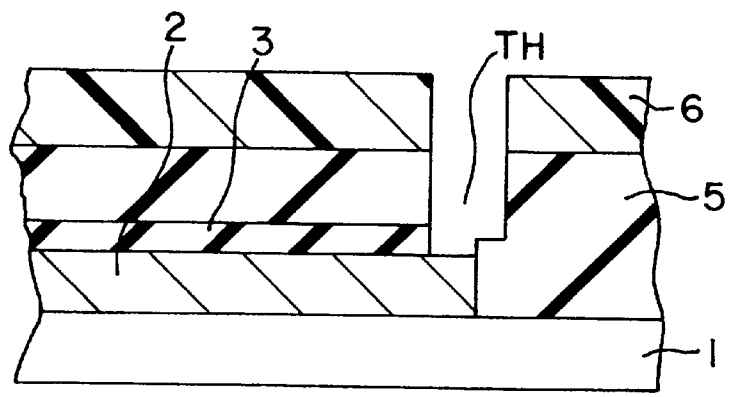

Next, referring to FIG. 4(e), only the exposed silicon nitride layer 3 is removed to accomplish a through hole TH by active ion etching using an etching gas which is made by adding a $N_2$ gas to $CF_4$ and $O_2$ gases to make $CF_4$ content low. And a photoresist layer 6 is removed.

Figure 4F:
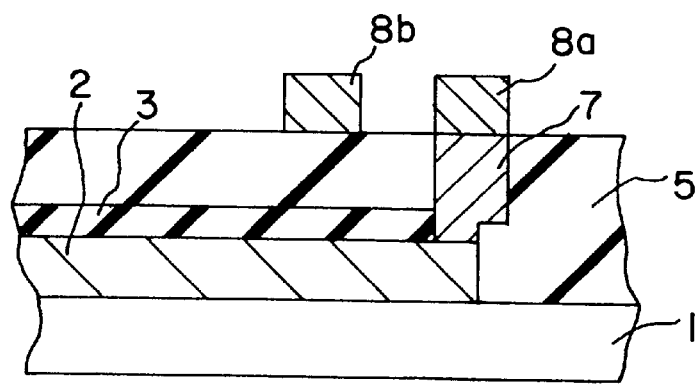

Finally, referring to FIG. 4(f), a conductive layer 7 comprising W, TiN, or Ti is implanted in the through hole TH. Next, an overlying layer 8 is formed by a sputtering technique and patterned. Moreover, the conductive layer 7 can be made by depositing W thereon with a CVD method and can be etched back or can be self-conformably formed by use of a selective growing method.

Figure 5:
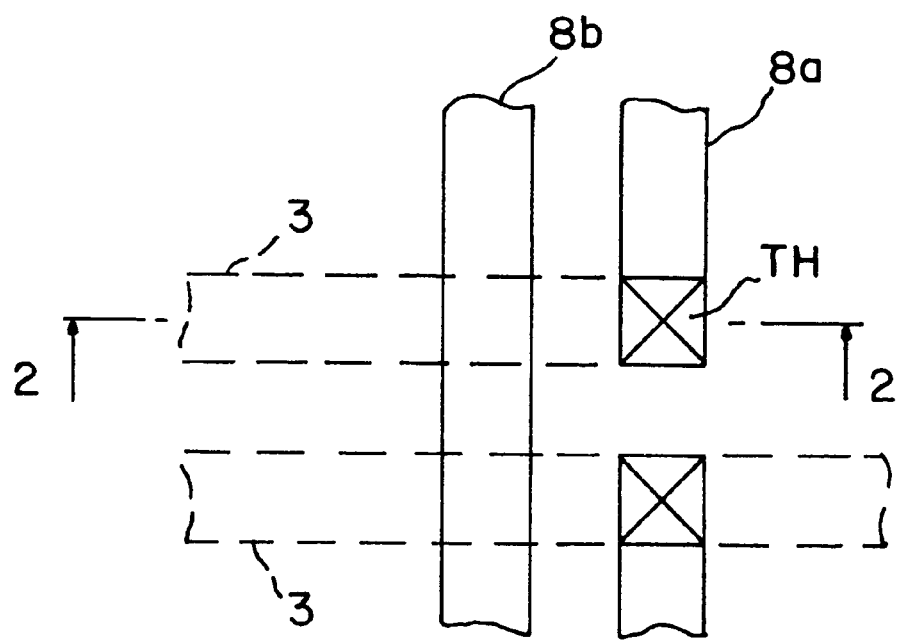
FIG. 5 is a plan view illustrating an interconnecting pattern formed by the present invention.

FIG. 5 is a plain view of FIG. 4(f), the through hole TH is online formed on the underlying layer 3, or to put it another way, a margin between the through hole TH and the underlying layer 3 is zero. Moreover, the through hole TH may be larger than the underlying layer 3; in the other words, a reverse margin is allowed.

Further, in the above-described preferred embodiment, a silicon oxide layer may be used instead of the silicon nitride layer 3 and an organic polymer layer, for example, a polyamide layer, may be used instead of the silicon oxide layer 5. In this case, a mixed gas of $CF_4$ and $O_2$ is used as an etching gas and the organic polymer layer is etched by increasing the etching speed of the organic polymer with $O_2$ content increased; on the other hand, the silicon oxide layer is etched by increasing the etching speed of the silicon oxide layer with $CF_4$ content increased. In other words, it is recommended that when the insulating layer 5 is etched, the insulating layer 3 is made to work as an etching stopper and when insulating layer 3 is etched, the insulating layer 5 is made to work as an etching stopper.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method for manufacturing a semiconductor device, comprising the steps of:

forming a first interconnecting layer over a semiconductor substrate;

forming a first insulating layer on said first interconnecting layer;

selectively removing said first insulating layer and said first interconnecting layer to form a patterned layer comprising respective remaining portions of said first insulating layer and said first interconnecting layer;

forming a second insulating layer to cover top and side surfaces of said patterned layer;

selectively etching said second insulating layer until a part of the remaining portion of said first insulating layer of said patterned layer is exposed, on condition that an etching rate of said second insulating layer is equal to or larger than that of said first insulating layer, to form a first opening in said second insulating layer while preventing said first opening from exposing any part of the remaining part of said first interconnecting layer of said patterned layer by intervention of said second insulating layer;

etching said part of the remaining portion of said first insulating layer exposed by said first opening until a part of the remaining portion of said first interconnecting layer is exposed, on condition that an etching rate of said first insulating layer is equal to or larger than that of said second insulating layer, to form a second opening in said remaining portion of said first insulating layer while preventing said second opening from exposing a portion other than said part of the remaining part of said first interconnecting layer; and forming a second interconnecting layer having a conducting portion filling said first and second openings in contact with said part of the remaining portion of said first interconnecting layer.

2. A method for manufacturing a semiconductor device as claimed in claim 1, wherein said first insulating layer comprises silicon nitride, and wherein said second insulating layer comprises silicon oxide.

3. A method for manufacturing a semiconductor device as claimed in claim 1, wherein said first insulating layer comprises silicon nitride, silicon oxide, or silicon nitride oxide, and wherein said second insulating layer comprises an organic polymer.

4. A method for manufacturing a semiconductor device as claimed in claim 1, wherein said first insulating layer comprises a silicon containing compound.

5. A method for manufacturing a semiconductor device as claimed in claim 4, wherein said second insulating layer comprises an organic polymer.

6. A method for manufacturing a semiconductor device as claimed in claim 1, wherein said step of forming a second insulating layer includes forming a plurality of sub-layers which comprise the second insulating layer.

7. A method for manufacturing a semiconductor device as claimed in claim 6, wherein said plurality of sub-layers includes an NSG layer.

8. A method for manufacturing a semiconductor device as claimed in claim 7, wherein said NSG layer is comprised of $O_3$/TEOS.

9. A method for manufacturing a semiconductor device as claimed in claim 6, wherein said plurality of sub-layers includes a silica film.

10. A method for manufacturing a semiconductor device as claimed in claim 9, wherein said silica film is formed by an applying method.

11. The method for manufacturing a semiconductor device as claimed in claim 1, wherein said step of selectively removing said first insulating layer and said first interconnecting layer is performed by etching each of said first insulating layer and said first interconnecting layer by using a photoresist layer as a mask.

* * * * *